(12) United States Patent  
Duineveld et al.

(10) Patent No.: US 7,122,957 B2  
(45) Date of Patent: Oct. 17, 2006

(54) ORGANIC ELECTROLUMINESCENT DEVICE AND A METHOD OF MANUFACTURING THEREOF

(75) Inventors: Paulus Cornelis Duineveld, Eindhoven (NL); Coen Theodorus Hubertus Fransiscus Liedenbaum, Eindhoven (NL); Eliav Itzhak Haskal, Eindhoven (NL); Ivo Godfried Jozef Camps, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 273 days.

(21) Appl. No.: 10/008,087

(22) Filed: Nov. 8, 2001

(65) Prior Publication Data

US 2002/0060518 A1    May 23, 2002

(30) Foreign Application Priority Data

Nov. 17, 2000 (EP) .................................. 00204053

(51) Int. Cl.  
  *H05B 33/02* (2006.01)
(52) U.S. Cl. .................. 313/506; 313/498; 313/509
(58) Field of Classification Search ............... 313/498, 313/506, 509  
  See application file for complete search history.

(56) References Cited

U.S. PATENT DOCUMENTS 5,682,043 A   10/1997   Pei et al. ..................... 257/40
5,701,055 A   12/1997   Nagayama et al. ......... 313/504
6,005,344 A *  12/1999   Fleming ...................... 313/498
6,306,559 B1*  10/2001   Tanamura et al. .......... 430/315

FOREIGN PATENT DOCUMENTS

EP       1009198 A1 *  6/2000
JP       09803935    *  3/1999
WO       WO0139272      5/2001

\* cited by examiner

*Primary Examiner*—Nimeshkumar D. Patel  
*Assistant Examiner*—Anthony Perry (57) ABSTRACT

An electroluminescent device (21) comprises a first (23) and a second (26) electrode layer, at least the second electrode layer (26) being provided in accordance with a desired pattern and one or more functional layers (24, 25R, 25G, 25B), the one or at least one of said functional layers being an electroluminescent layer. In order to pattern the second electrode layer (26) the EL device (21) comprises a relief pattern (27) having one or more overhanging sections (29). The EL device has means for hindering the transport of fluid along a capillary channel (33) formed by an overhanging section (29) and the surface (28a) supporting that section, an example of such means being protrusions (35) which block and/or reroute the capillary channel (33). Thus the transport of fluid by the channels (33) during manufacture of the EL device is hindered and color bleeding between pixels of the EL device and/or leakage current among electrodes of the first electrode layer is prevented.

9 Claims, 4 Drawing Sheets

ORGANIC ELECTROLUMINESCENT DEVICE AND A METHOD OF MANUFACTURING THEREOF

The invention relates to an electroluminescent device and a method of manufacturing thereof.

Generally, an electroluminescent (EL) device is a device comprising EL material capable of emitting light when a current is passed through it, the current being supplied by means of electrodes. If the EL material or any other functional material, if present, disposed between the electrodes is of organic or polymeric nature the device is referred to as an organic or polymer(ic) EL device respectively. In the context of the invention, the term organic includes polymeric.

EL devices of the diode type, light-emitting diodes, preferentially pass current in one direction and generally comprise EL material disposed between a hole-injecting electrode (also referred to as the anode), an electron-injecting electrode (also referred to as the cathode). Upon application of a suitable voltage, holes and electrons are injected into the EL material by the anode and cathode respectively. Light is produced by radiative recombination of holes and electrons inside the EL material. Using different organic EL materials, the color of the light emitted can be varied.

EL devices can be used as light sources and, in particular those of the organic type, are suitable for large area lighting applications such as a back light for a display. (Organic) EL devices comprising a plurality of electroluminescent elements (hereinafter also referred to as pixels) suitable for display purposes such as a monochrome or multi-color display device, a still image display, a segmented display device, or a matrix display of the passive or active type. Organic and in particular polymer EL devices can be made flexible or shaped allowing display applications not realizable with rigid and/or flat displays.

In U.S. Pat. No. 5,701,055 an electroluminescent display panel having a plurality of emitting portions is disclosed. The panel comprises first electrodes onto which organic functional layers are formed onto which second electrodes are formed. The panel further comprises electrical insulating ramparts projecting from the substrate. The ramparts have overhanging sections projecting in a direction parallel to the substrate. By providing shadow regions for the flux of metal vapor used to deposit the second electrode layer, the ramparts serve to provide a patterned second electrode layer.

A drawback of the known EL display panel is that the, in particular pattern-wise, deposition of the one or more functional layers is performed using vacuum deposition methods. Vacuum-based deposition methods require expensive equipment, are relatively time-consuming and are not particularly suited for mass-fabrication of large-surfaces. With respect to these aspects, the use of wet deposition methods such as spin-coating and ink-jet printing would be a significant improvement. However, efforts to provide the organic layers in the known EL device by means of wet deposition methods gave unsatisfactory results. For example, in the case of a multi-color display panel, the color separation was found to be unsatisfactory. Also, particularly evident in monochrome panels, inhomogeneities in brightness between pixels, and, in case of large pixels, also within pixels, are sometimes observed. Furthermore, when addressing an individual EL pixel, cross-talk and/or leakage current between neighboring pixels is observed in particular if the EL device comprises a charge transport layer deposited by a wet deposition method.

It is an object of the invention, inter alia, to alleviate these drawbacks.

In particular the object is to provide an EL device which has a homogeneous light emission and zero or at least for practical purposes negligible leakage current between neighboring pixels, even and in particular if one or more of the functional layers is deposited using a wet deposition technique in accordance with a pattern. Additionally, if the EL device is a multi-color device, a satisfactory color separation is to be achieved. Furthermore, the EL device is to be such that it can be manufactured in a simple and cost-effective manner.

These and other objects are achieved by an electroluminescent device comprising:

a first and a second electrode layer, at least the second electrode layer being provided in accordance with a desired pattern, one or more functional layers, the one or at least one of said functional layers being an electroluminescent layer, a relief pattern having one or more overhanging sections for defining the desired pattern of the second electrode layer, and means for hindering the transport of fluid along a capillary channel formed by an overhanging section and a surface supporting that overhanging section.

The EL device in accordance with the invention, if of the multi-color type, shows satisfactory color separation even and in particular if the one or at least one of the functional layers is provided using a wet deposition method such as spin-coating or ink-jet printing. The EL pixels of the device, if the EL device is of the multi-pixel type, emit substantially uniformly across the entire light emitting surface and no or at least an insignificant amount of leakage current between independently addressable neighboring electrodes is observed when only one these electrodes is driven and the other is maintained at a constant voltage corresponding to the off-state of the pixel(s) addressable therewith. This is even and in particular the case if the EL device comprises a charge transport layer provided by means of a wet deposition method.

The invention is based on the insight that overhanging sections, or more specifically the side-walls thereof, and the supporting surfaces supporting said sections jointly define channels capable of functioning as a capillary. Typically, at least in most applications, the desired pattern of the second electrode layer to be provided by the relief pattern is such that the capillary extends along many pixels. For example, in the case of a passive matrix display the capillary runs substantially along the entire length or width of the light emitting surface of the display. Selectively deposited fluid which comes into contact with the capillary is effectively drained from its original position and redeposited elsewhere if not in a neighboring pixel then at least in the capillary itself. In the case of an electroluminescent layer for a multi-color display, the fluid containing electroluminescent layer material is drained from and redeposited in pixels arranged to emit different colors, a process referred to as color bleeding. As a result, the pixels of the EL device do not emit the desired colors but mixed colors. In the case the drained fluid contains electroconductive (precursor) material such as charge transport material or electroluminescent material, an electrical connection via the capillary channel is established between neighboring pixels leading to a leakage current between neighboring pixels. In any case, the capillary causes fluid to be redeposited in the wrong areas, a situation which is to be prevented.

By providing means for hindering or even better preventing the transport of fluid along the capillary channel, color bleeding is prevented and/or reduction in leakage current is achieved.

Means for hindering the transport of fluid may be provided in a number of ways.

One way of hindering the transport of fluid along a capillary channel comprises selecting the viscosity of the fluid such that the transport is substantially prevented. The viscosity needed for effective hindering the transport of fluid along the channel has to be balanced against the viscosity requirements of the wet deposition method used to deposit the fluid.

In one embodiment of the electroluminescent device, the capillary effect is suppressed by providing a capillary channel of which the constituent surfaces are or made to be poorly wetting with respect to the fluid of which the transport is to be prevented. Ideally, if the contact angle, as determined for example in a separate contact angle measurement experiment, of the fluid and these surfaces measures 90° or more, the capillary effect is at least substantially completely suppressed and any further means of hindering fluid transport can be dispensed with all together. Contact angles of more than 50°, 60°, 70° or 80° may also be suitably used to hinder the transport of fluid. Poorly wetting surfaces can be obtained by using poorly wetting bulk material for the relief pattern and its supporting substrate. Alternatively or additionally, the surfaces constituting the channel may be subjected to an anti-wetting treatment to increase the contact angle between fluid and the surfaces. Anti-wetting treatments and agents for use in such treatments are well known in the art and include plasma treatments, corona discharge, surfactants and the like.

Another embodiment of the electroluminescent device is one wherein the means for hindering the transport of fluid comprises at least one protrusion extending from the relief pattern.

The protrusion has a function of blocking and/or rerouting the capillary channel in order to hinder the transport. Even if the protrusion has a free end, it is capable of functioning in that manner because it is very difficult for any drained fluid which reaches a protrusion to follow the rerouted capillary around the positive curvature or corners provided by the free end(s) of the protrusion even, as is generally and most conveniently the case for manufacturing purposes, if the protrusion itself has or is an overhanging section. The use of protrusions to hinder the drainage of fluid is attractive in that it does not render the manufacturing process more complex as the protrusion(s) can be provided together and simultaneous with the relief pattern as an integral part thereof. Generally but not necessarily, the protrusion extends transversely to the boundary of the relief pattern at the position of the protrusion.

The means for hindering the transport described hereinabove may be used separate to or in combination with each other.

The protrusion is extra in the sense that it is not essential for the definition of the pattern of the second electrode. As the protrusion occupies space which would have been available to the second electrode layer the protrusion reduces the conductivity of the electrode layer, its size should therefore be kept as small as possible yet sufficient to interrupt or reroute the capillary effectively.

A special type of protrusion may be provided to prevent leakage of fluid from any free end of a capillary channel. Such free ends are typically found at the periphery of the light emitting area of the display. The protrusion then functions as an end-stop. If a single protrusion is not enough to prevent the transport of fluid several may be provided in series. One embodiment of such an end-stop is a protrusion joining different, possibly mutually separate, parts of the relief pattern. For example, in a passive matrix display comprising a relief pattern of rows of overhanging sections the rows may be joined together at their free ends by a protrusion to prevent fluid form leaking out. The end-stops may also be used to prevent fluid from being transported from the display area into a contact pad area used for connecting the electrodes to any circuits exterior the display area such as driver electronics.

The protrusion needs to have sufficient positive curvature to be able to hinder the drainage of fluid by the capillary effectively. Provided such curvature is provided, the shape of the protrusion is not critical. Suitable shapes include a rectangular and a bulb shape. A protrusion may be arranged to have more than one sub-protrusions such as a fingered protrusion. Alternatively, a protrusion may be split into a number of mutually spaced protrusions of similar shape to increase its effectiveness for hindering flow along capillary channels.

Depending on the particular EL device, the size of the protrusion in the direction of the capillary, the width, can be anything from 0.1 µm upwards. Preferably, from 0.5 µm to 50 µm, or better from 1.0 to 20.0 µm. The size of the protrusion, in the direction of the capillary, is typically small compared to the size of the protrusion in the direction normal to the relief pattern, also referred to as the length. Suitably, the size along the capillary is about as large as the height of the relief pattern. By way of example, the flow along a V-shaped capillary channel measuring at the top of the V 3 to 5 µm could be effectively hindered by a 20 µm wide protrusion extending a distance of 60 µm in the direction normal to the direction of the channel.

Preferably, in order to reduce the capillary effect of the channels, the corners of the relief pattern should not have acute angles (the angle measured as sweeping space outside the relief pattern). In particular, to reduce the acuity of the angle of any corners, such as the corners formed where a protrusion joins the relief pattern, the corners are rounded off or alternatively, relief pattern material is added. For example, a joint defining a 90° corner as seen in a plan view, can be rounded-off to a quarter circle or a quarter circle segment can be added to create a bulge.

In any event, the specific size and shape of the protrusion needed to hinder the flow along the capillary depends on, inter alia, the size of the capillary, the rheological properties of the fluid and the physico-chemical surface properties of the relief pattern and supporting surface, the size and shape required for a particular application being simply a matter of straightforward experimentation.

The presence of the relief pattern allows the second electrode layer to be patterned in a simple, cost-effective and reliable manner. By providing the relief pattern with protrusions at suitable locations one or more of the functional layers can be provided in accordance with a pattern in a well-defined manner by a wet deposition method. Such methods are reliable, simple and cost-effective, can be suitably used for covering large surfaces and do not require the use of expensive vacuum equipment. Thus, the EL device can be manufactured in a simple, reliable and cost-effective manner.

Suitable wet deposition methods include spin-coating, web-coating, doctor blade, spray-coating, roller-coating, curtain-coating, dip-coating, painting or casting. Selective wet deposition techniques include printing methods such as ink-jet printing, silk-screen printing, off-set printing, flexo-printing, lithography and tampon printing.

Use of a wet deposition technique involves depositing a fluid containing functional material or precursor material thereof either selectively or non-selectively, and converting the fluid into functional layer material. In the context of the invention, fluid is understood to mean any deformable mass capable of flowing under pressure and includes suspensions, solutions, dispersions, pastes, inks, lacquers, emulsions, sols and the like.

Suitably, the electroluminescent device in accordance with the invention comprises a plurality of light emitting areas. The protrusions are then used to prevent functional layer material from being deposited in the wrong light emitting areas and/or in areas where no light emission is to occur.

For display purposes, the light areas are referred to as EL elements or pixels and are generally independently addressable electroluminescent elements (pixels). Each EL element has an area capable of light emission. The light emissive area is part of the EL layer. A light emissive area is formed by the area of overlap of a first electrode, a second electrode, and an organic EL layer. The EL device may be a segmented or matrix display device of the passive or active type. The plurality of first electrodes is provided in the form of a first, if required patterned, electrode layer. Similarly, the second electrodes are provided in the form of a second patterned electrode layer.

The relief pattern has one or more overhanging sections. Such an overhanging section is formed wherever the sidewall of the relief pattern has a part which makes an angle of more than 90° with respect to its supporting surface, the angle being defined as passing through the relief pattern. In the case of curved side-walls it is the set of tangents of a side-wall part which is the relevant parameter. An overhanging section is, for example, formed wherever the relief pattern widens if traversed in the direction normal to and away from the supporting surface. The overhanging section creates a shadow region on the supporting surface which prevents second electrode material from being deposited there if, for example, the second electrode is provided by means of vacuum vapor deposition.

Examples of relief patterns having an overhanging section are relief patterns having a T-, a mushroom-, or an inverse trapezoidal- or triangular-shaped transverse profile. In overhanging sections creating shadow regions of 1 to 2 μm width or less the risk of two neighboring second electrodes being electrically connected unintentionally is relatively high. A suitable width of the overhanging section is 2 to 10 μm. A preferred relief pattern has an inverse trapezoidal transverse profile with a base of 5 to 10 μm and a top of 15 to 30 μm. If the substrate is not rotating during the deposition process of second electrode material, the overhanging section may be even smaller. The risk of circuited second electrodes can be further reduced by splitting an overhanging section into a number of spaced parallel overhanging sections.

Further examples of suitable relief patterns having overhanging sections as well as method of manufacturing such relief patterns are described in the aforementioned U.S. Pat. No. 5,701,055.

The EL device may be any type of display such as a monochrome or multicolor display device, a still image display, a segmented display device, or a matrix display of the passive or active type.

Depending on the particular type of display, the first and/or second electrode layer may comprise one or more common electrodes. A common electrode is one which serves as the second electrode of more than one EL element.

Generally, in a (multi-color) segmented display device, at least the first or second electrode layer comprises common electrodes.

In a matrix display of the active type, EL elements are driven by means of active switching elements such as thin film transistors (TFTs). Generally, an active matrix device comprises a single common second (first) electrode and the (second) first electrodes are independently addressable.

The first electrode layer may be electron-injecting and the second electrode layer hole-injecting. Alternatively, the first electrode layer is hole injecting and the second electrode layer is electron injecting.

An electron-injecting electrode is suitably made of a metal(alloy) having a low work function, such as Yb, Ca, Mg:Ag Li:Al, Ba or is a laminate of different layers such as Ba/Al or Ba/Ag electrode.

A hole-injecting electrode is suitably made of a metal (alloy) having a high work function such as Au, Pt, Ag. Preferably, a more transparent hole-injecting electrode material, such as an indiumtinoxide (ITO), is used. Conductive polymers such as a polyaniline (PANI) and a poly-3,4-ethylenedioxythiophene (PEDOT) are also suitable transparent hole-injecting electrode materials. Preferably, a PANI layer has a thickness of 50 to 200 nm, and a PEDOT layer 100 to 300 nm. If an ITO hole-injecting electrode is used, the first electrode is preferably the hole-injecting electrode.

The EL device comprises one or more functional layers. In order to fully exploit the benefits of the invention, the one or more functional layers are preferably provided using a wet deposition method as described hereinabove.

The one or, if there is more than one, at least one of the functional layers is an electroluminescent layer. The EL layer is made of a substantially, preferably organic, electroluminescent material. In the context of the invention, the type of EL material used is not critical and any EL material known in the art can be used. Suitable organic EL materials include organic photo- or electroluminescent, fluorescent and phosphorescent compounds of low or high molecular weight. Suitable low molecular weight compounds are well known in the art and include tris-8-aluminium quinolinol complex and coumarins. Such compounds can be applied using vacuum-deposition method. Alternatively, the low molecular weight compounds can be embedded in a polymer matrix or chemically bonded to polymers, for example by inclusion in the main chain or as side-chains, an example being polyvinylcarbazole.

Preferred high molecular weight materials contain EL polymers having a substantially conjugated backbone (main chain), such as polythiophenes, polyphenylenes, polythiophenevinylenes, or, more preferably, poly-p-phenylenevinylenes. Particularly preferred are (blue-emitting) poly (alkyl)fluorenes and poly-p-phenylenevinylenes which emit red, yellow or green light and are 2-, or 2,5-substituted poly-p-phenylenevinylenes, in particular those having solubility-improving side groups at the 2- and/or 2,5 position such as $C_1$–$C_{20}$, preferably $C_4$–$C_{10}$, alkyl or alkoxy groups. Preferred side groups are methyl, methoxy, 3,7-dimethyloctyloxy, and 2-methylpropoxy. More particularly preferred are polymers including a 2-aryl-1,4-phenylenevinylene repeating unit, the aryl group being optionally substituted with alkyl and/or alkoxy groups of the type above, in particular methyl, methoxy, 3,7-dimethyloctyloxy, or, better still, 2-methylpropoxy. The organic material may contain one or more of such compounds. Such EL polymers are suitably applied by wet deposition techniques.

In the context of the invention, the term organic includes polymeric whereas the term polymer and affixes derived therefrom, includes homopolymer, copolymer, terpolymer and higher homologues as well as oligomer.

Optionally, the organic EL material contains further substances, organic or inorganic in nature, which may be homogeneously distributed on a molecular scale or present in the form of a particle distribution. In particular, compounds improving the charge-injecting and/or charge-transport capability of electrons and/or holes, compounds to improve and/or modify the intensity or color of the light emitted, stabilizers, and the like may be present.

The organic EL layer preferably has an average thickness of 50 nm to 200 nm, in particular, 60 nm to 150 nm or, preferably, 70 nm to 100 nm.

Optionally, the EL device comprises further, preferably organic, functional layers disposed between the electrodes. Such further layers may be hole-injecting and/or transport (HTL) layers and electron-injecting and transport (ETL) layers. Examples of EL devices comprising more than one functional layer are a laminate of anode/HTL layer/EL layer/cathode, anode/EL layer/ETL layer/cathode, or anode/HTL layer/EL layer/ETL layer/cathode.

Suitable materials for the hole-injecting and/or hole-transport layers (HTL) include aromatic tertiary amines, in particular diamines or higher homologues, polyvinylcarbazole, quinacridone, porphyrins, phthalocyanines, polyaniline and poly-3,4-ethylenedioxythiophene.

Suitable materials for the electron-injecting and/or electron-transport layers (ETL) are oxadiazole-based compounds and aluminiumquinoline compounds.

If ITO is used as the anode, the EL device preferably comprises a 50 to 300 nm thick layer of the hole-injecting/-transport layer material poly-3,4-ethylenedioxythiophene or a 50 to 200 nm thick layer of polyaniline.

Generally, the EL device comprises a substrate. Preferably, the substrate is transparent with respect to the light to be emitted. Suitable substrate materials include transparent synthetic resin which may or may not be flexible, quartz, ceramics and glass. The substrate provides the supporting surface for the relief pattern.

Apart from defining the pattern of the second electrode layer, the relief pattern may, if desired, also serve to define the pattern of the one or more functional layers.

Therefore, a preferred embodiment of the EL device in accordance with the invention is characterized in that the relief pattern has one or more positively-sloped sections.

A positively-sloped section is the opposite of an overhanging section. The tangents of the boundary of the transverse profile of the positively-sloped section all make angle of less than 90° with the supporting surface, the angle being defined as passing through the relief pattern. A section having straight slopes (side-walls) is considered either positively-sloped or overhanging.

A positively-sloped section has the effect of being capable of patterning the functional layer(s) but not the second electrode layer. By providing a relief pattern having both positively-sloped and overhanging sections both the second electrode layer and one or more of the functional layers can be provided in a desired pattern. The pattern of the electrode layer can be independently selected from that of the functional layers. For example, in the case of a functional layer deposited by means of a selective wet deposition method such as ink jet printing, the relief pattern serves to contain the fluid comprising the functional layer material and prevents it from spreading into unwanted areas. Unexpectedly, it is furthermore possible to provide a patterned functional layer using a non-selective wet coating method such as spin-coating. In the latter case the height, width and shape of the relief pattern is chosen such that the fluid layer breaks up into fluid areas in accordance with the desired pattern each area being then converted into a corresponding area of functional material. To promote break-up, the transverse profile of the positively-sloped section is preferably rounded.

In a preferred embodiment of the invention, the relief pattern is a composite relief pattern comprising a first relief pattern having overhanging sections overlaying or underlying a second relief pattern having positively-sloped sections.

In case a relief pattern having both positively-sloped and overhanging sections is desired, the relief pattern is preferably provided as a first relief pattern having overhanging section overlying or underlying a second relief pattern having positively-sloped sections because such a composite pattern can be conveniently manufactured by using two photolithographic steps in succession. Generally, the layout of the first and second relief pattern is mutually different. Generally, in this embodiment the first relief pattern by itself determines the pattern of the second electrode layer while the combined first and second relief pattern defines the pattern of any functional layer to be patterned and defines the boundary of the pixel in the case of a multi-pixel device. Suitably, the composite relief has a first relief pattern which overlays the second relief pattern. This has the advantage that the capillary channel formed by the first relief pattern has to go uphill to pass to cross the second relief pattern thus reducing the capillary effect of the channel. Generally however, the capillary effect is not sufficiently suppressed and protrusions extending transversely from the boundary of the first relief pattern are provided at those locations where the first relief pattern crosses the second relief pattern to further reduce the capillary effect of the channels. Alternatively, the second relief pattern may overlay the first relief pattern. This has the advantage that the second relief pattern may provide the protrusions needed to block the capillary channels of the first relief pattern at the desired locations but may increase of the risk of inadvertently connecting second electrodes of the second electrode layer.

In a preferred embodiment of the invention, the first and second relief pattern are directly supported by a same substrate surface, except where the first and the second relief pattern cross each other.

By providing the first and second relief pattern on substantially the same supporting surface the average height of the composite relief pattern is reduced and more uniform across the display area of the device. This makes it more simple to deposit a functional layer having a uniform thickness across the device (within and between the pixels, in case of a multi-pixel device) if provided by means of a wet, in particular non-selective, deposition method.

In a further preferred embodiment, the second relief pattern provides the supporting surface of the first relief pattern.

The composite relief pattern according to this embodiment has the advantage that the first and second relief pattern are provided on a substantially level supporting surface. Generally, the transverse profile of the first relief pattern is selected to be narrower than the transverse profile of the second relief pattern. In other words, the projection of the first relief pattern onto the surface supporting the composite relief pattern is a sub-area of the corresponding projection of the second relief pattern. If this is the case, the first relief pattern does not contribute to the definition of any functional layer to be patterned by wet deposition method but the second relief pattern alone defines the outline of such functional layer. Thus the outline of the pixels of a multi-pixel EL device is provided by the second relief pattern. The protrusions blocking the capillary channels are provided on top of the second relief pattern and extend from the boundary of the first relief pattern.

In a particular embodiment of the invention, the EL device is a matrix display device of the passive type comprising row electrodes as the first electrode layer, column electrodes as the second electrode layer, independently addressable electroluminescent elements formed at crossings of row and column electrodes, and the relief pattern having overhanging sections in the form of strips extending along and between the column electrodes.

Generally, a protrusion extends transversely to the overhanging sections and is positioned in the boundary areas between pixels.

The size of the EL elements is selected in accordance with the application. For high definition pixels of 10 to 75 µm can be used. For less demanding applications a pixel size of 100 to 300 µm may be sufficient. In multi-color displays, a red, a green and a blue light-emitting pixel is grouped in an RGB pixel. For example, the red, green and blue each measures 100 by 300 µm giving an RGB pixel of 300 by 300 µm. The width of the strips of relief pattern defines the distance between the EL elements (pixels) along the column electrodes. This distance is preferably selected as small as possible to maximize the fill-factor, defined as the total area available for light emission divided by the total area of the display. Typically, the width of the strips is 10 to 40 µm or better 15 to 30 µm.

Similarly, the width of the protrusion, that is the dimension in the longitudinal direction of the column electrodes, is not critical but in order to maximize the fill-factor needs to be as small as possible. Suitably the width of the protrusion is 2 to 50 µm, or better, 3 to 30 or preferably, 5 to 20 µm.

The length (dimension in the direction normal to the column electrodes) of the protrusion must be less than the dimension of the pixel in the longitudinal direction of the row electrodes because otherwise the column electrode will be interrupted and the pixel cannot be addressed. A suitable length is 2 to 100 µm or, better, 5 to 75 or still better 10 to 60 µm. Below 2 µm the protrusion becomes unstable due to the overhang at its free end. Above 100 µm the extent to which fluid flow along channel is hindered does not increase anymore.

The passive matrix display may comprise a composite relief pattern, for example a stack of a first relief pattern in the form of strips having overhanging sections which extend between and along the second electrodes, that is the column electrodes, and a second relief pattern in the form of strips extending along and between the row electrodes of the first electrode layer.

Preferably, the matrix display has a composite relief pattern in which the second relief pattern is in the form of a mesh which extends between and along both the row and column electrodes and a first relief pattern extending along the row electrodes provided on top of the second relief pattern, the second relief pattern defining the outline of the pixels of the device.

Acute corners (90° or less) enhance capillary effects. Therefore, in order to reduce the acuity of the corners formed by the relief pattern, the corners of the first and second relief pattern are preferably rounded.

As the EL device in accordance with the invention requires a potential of only a few volts to provide a brightness suitable for display purposes and/or consumes a small amount of power the EL device is particularly suitable for displays of battery operated and/or portable, in particular hand-held, electronic equipment such as lap top computers, palm top computers, personal organizers, mobile phones optionally provided with internet access or other services requiring the presentation of (video) images. The EL device allows internet data and image data to be displayed at video rates.

In another aspect, the invention therefore relates to a battery-operated and/or hand-held electronic device, such as a mobile phone, provided with an EL display device in accordance with the invention.

The invention also relates to a method of manufacturing an electroluminescent device comprising a first and a second electrode layer, at least the second electrode layer being provided in accordance with a desired pattern, one or more functional layers, the one or at least one of said functional layers being an electroluminescent layer, a relief pattern having one or more overhanging sections for defining the desired pattern of the second electrode layer, and means for hindering the transport of fluid along a capillary channel formed by an overhanging section and a surface supporting that overhanging section, said method comprising the step of providing the functional layer or at least one of the functional layers by means of a wet deposition method.

Providing means for hindering the transport of fluid along the channels, allows the one or more functional layers to be deposited by a wet deposition methods without resulting in a leakage current and/or cross-talk between neighboring pixels. Also, in case of a multi-color device, color bleeding between light emitting areas arranged to emit different colors is significantly reduced. The use of the wet deposition methods to deposit the functional layers leads to a simple and cost-effective manufacturing methods suitable for mass-production and large areas.

Typically, the method in accordance with the invention is a method which comprises providing, in succession, substrate (optional), a first electrode layer, a relief pattern having one or more overhanging sections for defining the second electrode layer, one or more functional layers by means of a wet deposition method, and a second electrode layer patterned by means of the relief pattern. In addition the method includes the step of providing the means for hindering the transport of fluid along the capillary channel(s). As demonstrated by the embodiments presented hereinbelow, generally, this step is performed as part of and simultaneous to one of the other method steps.

In one embodiment of the method in accordance with the invention, the step of providing the means for hindering the transport of fluid is implemented by providing a relief pattern having overhanging sections of which the side-walls are poorly wetting on a poorly wetting supporting surface, where poorly wetting is understood to mean poorly wetting with respect to the fluid of which the transport is to be prevented and as determined by a contact angle measurement of the fluid and the surface concerned. Poorly wetting corresponds to a contact angle having a value as defined hereinabove. In particular, poorly-wetting side-walls and/or supporting surface may be provided by manufacturing the relief pattern and the supporting surface of poorly-wetting bulk material. Alternatively, bulk material can be rendered poorly-wetting by subjecting it to an anti-wetting treatment. Such anti-wetting treatments are well-known to those skilled in the art. In the case of a photoresist relief pattern the anti-wetting treatment may comprise exposing the photoresist surface to fluorinated hydrocarbons.

A preferred embodiment of the method in accordance with the invention comprises the step of providing a relief pattern comprising at least one protrusion blocking and/or rerouting a channel formed by an overhanging section and a surface supporting that overhanging section. The protrusions serve as the hindering means.

Providing the relief pattern with protrusions is an attractive method to hinder transport of fluid as it does not make the manufacturing process more complex. After all, the protrusions can be provided simultaneously with the relief pattern having overhanging sections, only the mask used in the pattern-wise exposure needs to be modified.

In an alternative method in accordance with the invention the means of hindering the transport of fluid along the channels is incorporated in the fluid used in wet deposition method. One embodiment of such a method comprises using a fluid which is poorly wetting with respect to the surfaces from which the channel is formed. Those skilled in the art will appreciate that there are many ways to achieve this, a simple one being changing the polarity of the fluid by changing the solvent composition. In another embodiment the viscosity of the fluid is adapted such that, on the time scale of the deposition of the functional layer, fluid is transported over distances less than the distances separating pixels.

Examples of suitable first and second electrode layers, functional layers and relief patterns have already been described hereinabove. Individually, each of the method steps required to manufacture the EL device is conventional and well-known to those skilled in the art. For example, a composite relief pattern can be conveniently manufactured by performing two photolithographic steps in succession.

The wet deposition method step involves providing a layer of fluid containing functional layer material or precursor material thereof, which layer of fluid is then converted into a functional layer. Examples of functional layers include a hole transport layer, hole injecting layer, an electroluminescent layer, an electron injecting layer an electron transport layer.

The fluid layer has fluid in a form as defined hereinabove. After the fluid layer is deposited it is converted to the functional layer. The conversion may involve exposing, if required in an inert atmosphere, the fluid layer to increased or reduced temperatures, increased or reduced pressure, and/or radiation. Preferably, the conversion is performed at an elevated temperature.

If the functional layer material is present as such in the fluid layer, it may be sufficient to evaporate a solvent and/or other volatile components. If the fluid layer contains a precursor material of the functional material the conversion also involves a chemical reaction. The wealth of chemical reactions known to those skilled in the art of chemistry may be exploited to derive suitable precursor materials. A preferred precursor material contains leaving groups which are eliminated during the conversion.

The fluid layer may contain further substances. For example, substances which modulate its rheological properties such as viscosity, (visco)elasticity, contact angle and/or wettability. Wetting agents, or anti-wetting agents, leveling agents, surfactants, thickening agents, diluents and the like may be added.

If a non-selective coating method is used then the choice among such methods is not critical and can be, for example, dip-coating, spray coating, curtain coating, doctor blade, web coating, spin-coating, and Langmuir-Blodgett. Nonetheless, quite unexpectedly, patterned functional layers can be deposited in a uniform manner over a large surface using non-selective wet deposition method like spin-coating.

A preferred method of coating is ink-jet printing using a jet consisting of ink drops or a continuous jet (also referred to as dispensing). In order to increase throughput and/or relative alignment accuracy, the use of multi-nozzle ink-jet printing heads is preferred. In a preferred method of ink-jet printing, ink jet printing is performed at constant frequency and the ink jet printing head is moved at constant velocity resulting in a series of ink drops deposited equidistantly on the substrate.

In the case of a multi-color passive matrix display, a preferred method comprises moving the ink jetting printing head in a direction at right angles to the second electrodes which after conversion of the fluid layer results in an array of pixels of the same color extending parallel to the first electrode. Directly after deposition, the equidistantly placed ink drops merge into an uninterrupted line of fluid thus automatically ensuring that electroluminescent layer material is evenly distributed among the pixels arranged to emit the same color even if the periodicity is not an integral number of times the pixel periodicity. The line of fluid is not interrupted by the first relief pattern because typically the fluid level is arranged to be initially higher than the total height of the relief pattern.

In another preferred embodiment of the method, the relief pattern having overhanging sections is, apart from patterning the second electrode, used for patterning the one or more functional layers. In that case the inkjet head is moved parallel to the overhanging sections to fill the spaces defined by the overhanging sections of the relief pattern. A separate relief pattern for defining the outline of the functional layers is not required. Because in this embodiment there is no barrier against the transport of fluid along the capillary channels, the use of protrusions and/or end-stops as described hereinabove is particularly relevant. Furthermore, it has been observed that in the spaces near the free ends of the overhanging sections evaporation of fluid may proceed faster because the surface area available for evaporation is larger near such a free end. The faster evaporation rate is a driving force for the transport of fluid along the capillary channel from to the free end which leads inter alia to non-uniform layers.

The protrusion and/or end-stops are normally positioned extending at right angles to the overhanging sections and may extend from one overhanging section to another. For example, in the case of a relief pattern comprising a set of parallel mutually spaced line-shaped overhanging sections for use in a passive matrix display, the protrusions may join neighboring sections without this leading to an undesirable interruption of the second electrode layer provided that the protrusion itself has no overhanging section. In this embodiment, that is the embodiment in which the overhanging sections are used to pattern the second electrode layer and one or more functional layers by moving the ink-jet head along and between the overhanging sections, the protrusion should be at least half the height of the fluid layer thickness if transport of fluid is to be effectively hindered.

Although the invention is discussed hereinabove in relation to an electroluminescent device of the diode type, also referred to in the art as a light emitting diode, the device in accordance with the invention can be any electroluminescent device. It may be of the inorganic type but preferably is of the organic type. It may be a unipolar electroluminescent device, that is a device in which injection of charge carriers of only one polarity is sufficient to generate light. It may also be of the bipolar type which requires injection of both holes and electrons to generate light. The latter type includes the light emitting cell (LEC) as disclosed in U.S. Pat. No. 5,682,043 which does not require electrodes of different work function to get observable light emission and the light emitting diode (LED) which requires electrodes of high work function to inject holes and an electrodes of low work function to inject electrons. Also included are electroluminescent devices where the charge injecting electrodes are arranged subjacent or, alternatively, adjacent with respect to each other.

These and other aspects of the invention will be apparent from and elucidated with reference to the embodiments described hereinafter.

Embodiment 1 (Not in Accordance with the Invention)

Figure 1:
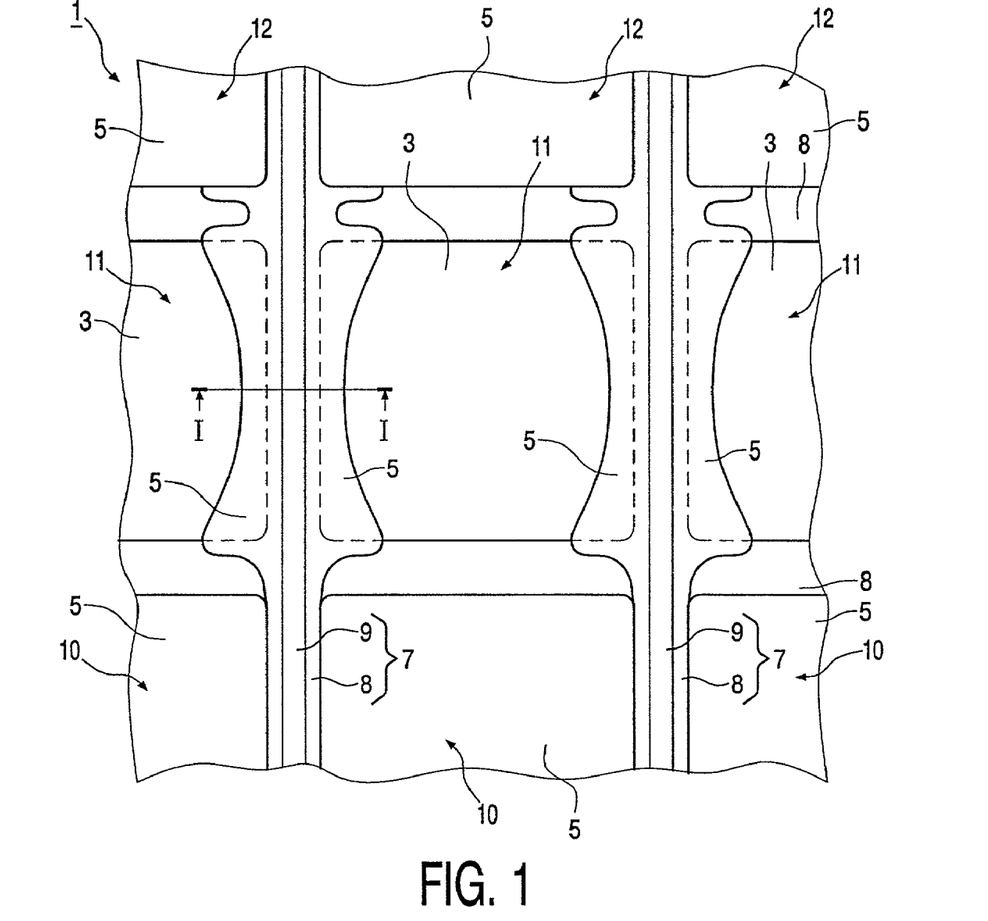
FIG. 1 shows, drawn to scale and in a plan view, a part of an EL device not in accordance with the invention at a stage of manufacture obtained after pattern-wise deposition of an electroluminescent layer.

FIG. 1 shows, drawn to scale and in a plan view, a part of an EL device not in accordance with the invention at a stage of manufacture obtained after pattern-wise deposition of an electroluminescent layer. FIG. 1 is drawn to scale and represents an image when the EL device 1 is inspected through an optical microscope.

Figure 1A:
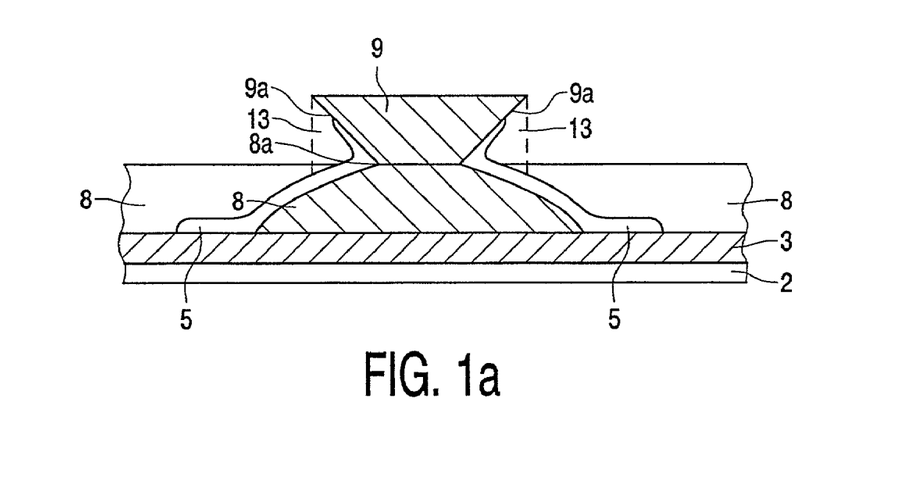
FIG. 1A shows a cross-sectional view along the line I—I of FIG. 1.

FIG. 1A shows a cross-sectional view along the line I—I of FIG. 1. For the sake of clarity, the direction normal to the substrate is not drawn at a different scale than the directions in the plane of the substrate.

The EL device 1 is a multi-color passive matrix display device having 300 μm by 300 μm EL elements (pixels) 10, 11 and 12 and comprises a glass substrate 2 provided with a first electrode layer 3 in the form of ITO hole-injecting row electrodes. It further comprises a composite relief pattern 7 of a first relief pattern 9 which has overhanging sections for defining the pattern of a second electrode layer (not shown) and a second relief pattern 8 having positive-sloped sections underlying the first relief pattern 9. The angle of inclination of the overhanging sections is 45°, the height of the relief pattern 9 is about 2.5 μm and the height of the second relief pattern 8 is 4.5 μm. Indicated with reference sign 5 is a pattern-wise deposited electroluminescent layer arranged to emit light of a first color.

The electroluminescent layer 5 was manufactured using an ink-jet method wherein a nozzle releasing, at constant frequency, a jet of 150 pl drops of fluid containing solvent and electroluminescent layer material, a red-emissive fluorene-based polymer supplied by Cambridge Display Technology Ltd., is moved at constant velocity across the EL elements 12 and then across the pixel areas 10. The equidistantly placed ink drops merge to from an uninterrupted line of fluid drops, thereby spreading the fluid evenly among the pixel areas 12 and 10 respectively. The diameter of the nozzle (jet), 50 μm, is much smaller than the pixel size. The position accuracy of the nozzle is better than 10 μm.

In each of the pixels 10 and 12 a fluid layer of thickness 6 μm is deposited (volume of fluid 450 pl) is deposited which, when converted, gives a layer 5 of about 70 nm thickness.

FIG. 1 clearly shows that, despite the selective deposition into pixels 10 and 12, EL material is, after conversion, present in areas 11 as well. Apparently, fluid has bled into the pixel areas 11. The bleeding is caused by the capillary action of the channels 13 formed by side-walls 9a of the overhanging sections of the first relief pattern 9 and the supporting surface 8a provided by the second relief pattern 8. The channels 13 drain fluid from the pixel areas 10 and 12 and redeposit the drained fluid in the neighboring pixel areas 11. If at some stage (before, after or simultaneous to the deposition of layer 5) of the manufacturing process the areas 11 are filled with EL material selected to emit light of a color different from the EL layer 5 the EL pixels 11 are actually going to emit light of a mixed color leading to a poor color separation. Although in FIG. 1 the EL layer 5 is shown to only partially cover the pixel areas 10, depending on the particular conditions under which the deposition takes place, the EL layer 5 may, inadvertently, cover the pixel areas 10 completely.

The pattern of the EL layer 5 in the region between pixels 12 and 11 on the one hand and the region between pixels 10 and 11 on the other hand is asymmetric. This is a result of the fact that the EL layer in pixels 10 and 12 is deposited in succession. Apparently, the presence of EL material as such affects the transport of fluid along the capillary channel as well in that it modifies the wettability of the relief pattern. If the EL layer 5 renders the surface of the relief pattern less wettable the transport of fluid along the channels 13 is hindered.

The problem of the capillary action of the channels 13 has been demonstrated by the bleeding of electroluminescent layer material into neighboring pixels. However, the problem is not limited to such functional layers. For example, in the case of a charge transport layer, due to the capillary action of the channels 13, after conversion, charge transport material is present in each channel 13 along its entire length including those sections where the channels 13 cross the second relief pattern 9. This leads to a charge transport layer in which the charge transport areas in the same column are mutually connected. The charge transport areas in the same column being mutually connected and the charge transport layer having a relatively high conductivity, a significant leakage current will flow between, for example, the row electrodes 3 of the pixels 10 and 11 if only one of these row electrodes 3 is driven and the other one is maintained at a constant potential corresponding to the off-state of a pixel.

Embodiment 2 (In Accordance with the Invention)

Figure 2:
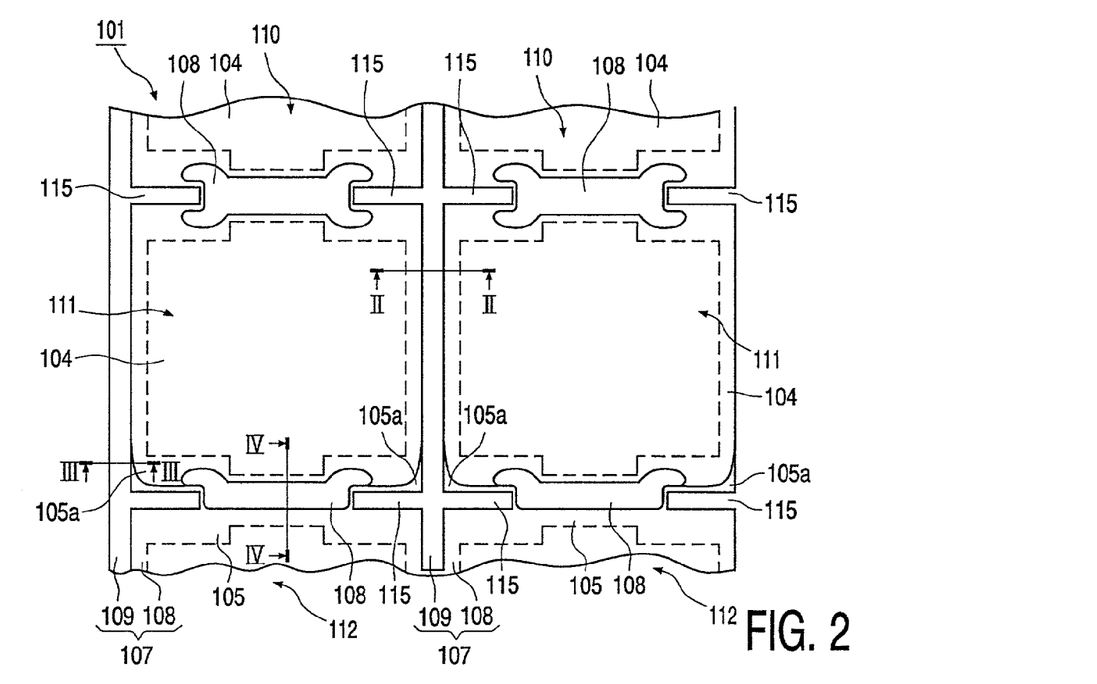
FIG. 2 shows, drawn to scale and in a plan view, a part of an EL device in accordance with the invention at a stage of manufacture after deposition of a electroluminescent layer.
Figure 2A:
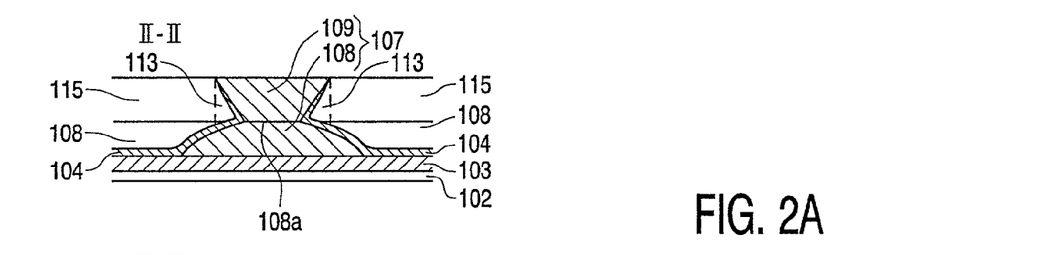
FIGS. 2A, 2B and 2C show enlarged cross-sectional views along the lines II—II, III—III and IV—IV respectively of FIG. 2, FIG. 3 schematically shows, in a perspective plan view, a part of an organic EL matrix display device in accordance with the invention, and FIG. 4 schematically shows a mobile phone provided with an EL device in accordance with the invention.
Figure 2B:
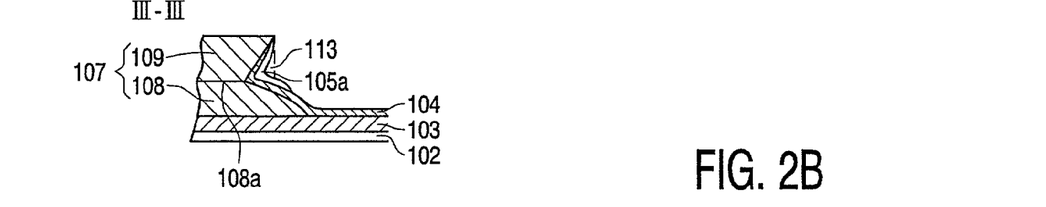
Figure 2C:
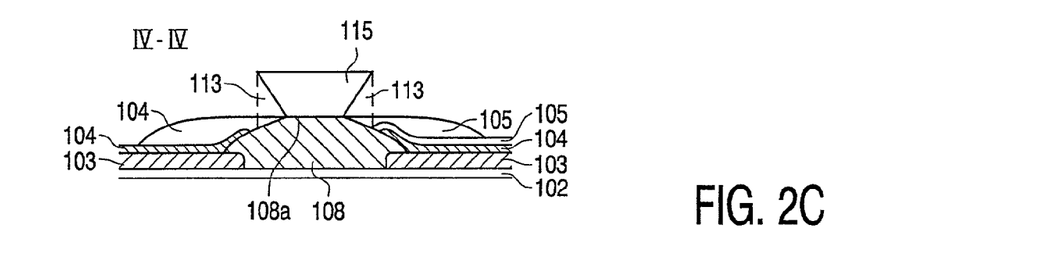

FIG. 2 shows, drawn to scale and in a plan view, a part of an EL device in accordance with the invention at a stage of manufacture after deposition of a electroluminescent layer, and FIGS. 2A, 2B and 2C show enlarged cross-sectional views along the lines II—II, III—III and IV—IV of FIG. 2 respectively. For the sake of clarity, the direction normal to the substrate is not drawn at a different scale than the directions in the plane of the substrate.

The device 101 is a passive matrix multi-color EL device having EL pixel areas 110, 111, and 112. The device 101 comprises a substrate 102 covered with row electrodes 103 and a composite relief pattern 107 comprising a first relief pattern 109 having overhanging sections for patterning a second electrode layer (not shown) and a second relief pattern 108, underlying the first relief pattern 109, having positively-sloped sections. The relief pattern 109 has protrusions 115, each extending, at the position of the protrusion, transversely to the boundary of the first relief pattern 109. The protrusions 115 block and/or reroute the channels 113 formed by the overhanging section of the first relief pattern 109 and its supporting surface 108a provided by the second relief pattern 108 and thus serve as means for hindering the transport of fluid along the capillary channel(s) 113.

The protrusions 115 are supported by the second relief pattern 108 and at those positions, the relief pattern 108 is somewhat broadened, 10 to 100% broader than the width of the relief pattern 109, compared to sections of the relief pattern 108 extending beyond the free ends of the protrusions 115. The broadened sections render the protrusions 115 more effective in hindering the transport of fluid along the capillary channel(s).

The structure described so far is manufactured in the same manner as in embodiment 1 (of course using masks adapted to provide the protrusions 115 and broadened sections).

The EL device 101 further comprises a charge transport layer 104. In this embodiment the functional layer 104 is ink-jet printed by depositing, into the pixels 110, 111 and 112, 120 pl drops of a 3% by weight aqueous solution of PEDOT (supplier Bayer AG), 60 microns apart, in a straight line and in a direction at right angles to the strips of the first relief pattern 108 having the overhanging sections. After deposition the drops merge in a fluid layer essentially consisting of lines of fluid 8 μm high which is much higher than the height of the relief pattern 107. The volume of PEDOT solution deposited is each pixel 110, 111, 112 is about 600 pl. After conversion by evaporating the solvent each of the pixels 110, 111 and 112 is provided with a 200 nm thick charge transport layer 104.

As is clear from FIGS. 2A and 2B, charge transport layer material is deposited in the capillary channels 113. Referring to FIG. 2, the charge transport areas of the pixels 110 are not completely separated from those of pixels 111. Just beyond the free ends of the protrusions 115, the pixels 110 are connected via a narrow path of charge transport material. As a result a leakage current, be it a small one, is still measured between the ITO electrodes 103 when, for example, a pixel 110 is driven while keeping the neighboring pixel 111 at a constant potential corresponding to an off-pixel state. However, the leakage current is reduced with a factor of at least 3 to 4 compared to an EL device having a relief pattern without the protrusions 115.

Reference signs 105 indicate a pattern-wise deposited electroluminescent layer. The EL layer 105 is deposited in exactly the same manner as in embodiment 1 that is by means of a nozzle which is moved across the pixel areas in a direction at right angles to the strips of the first relief pattern 109, while releasing a jet of fluid drops containing electroluminescent layer material. Comparing FIGS. 1 and 2 it is clear that the protrusions 115 serve to hinder the transport of fluid along the capillary channels 113. The areas of EL material indicated with reference sign 105a indicate that some fluid drained from the pixel area 112 has been able to pass the protrusions 115 but this material is redeposited outside the light emitting part of the pixels 111, the periphery of the pixels being indicated by the interrupted line in FIG. 2. Thus color bleeding is effectively prevented and a satisfactory color separation is obtained.

Embodiment 3 (In Accordance with the Invention)

Figure 3:
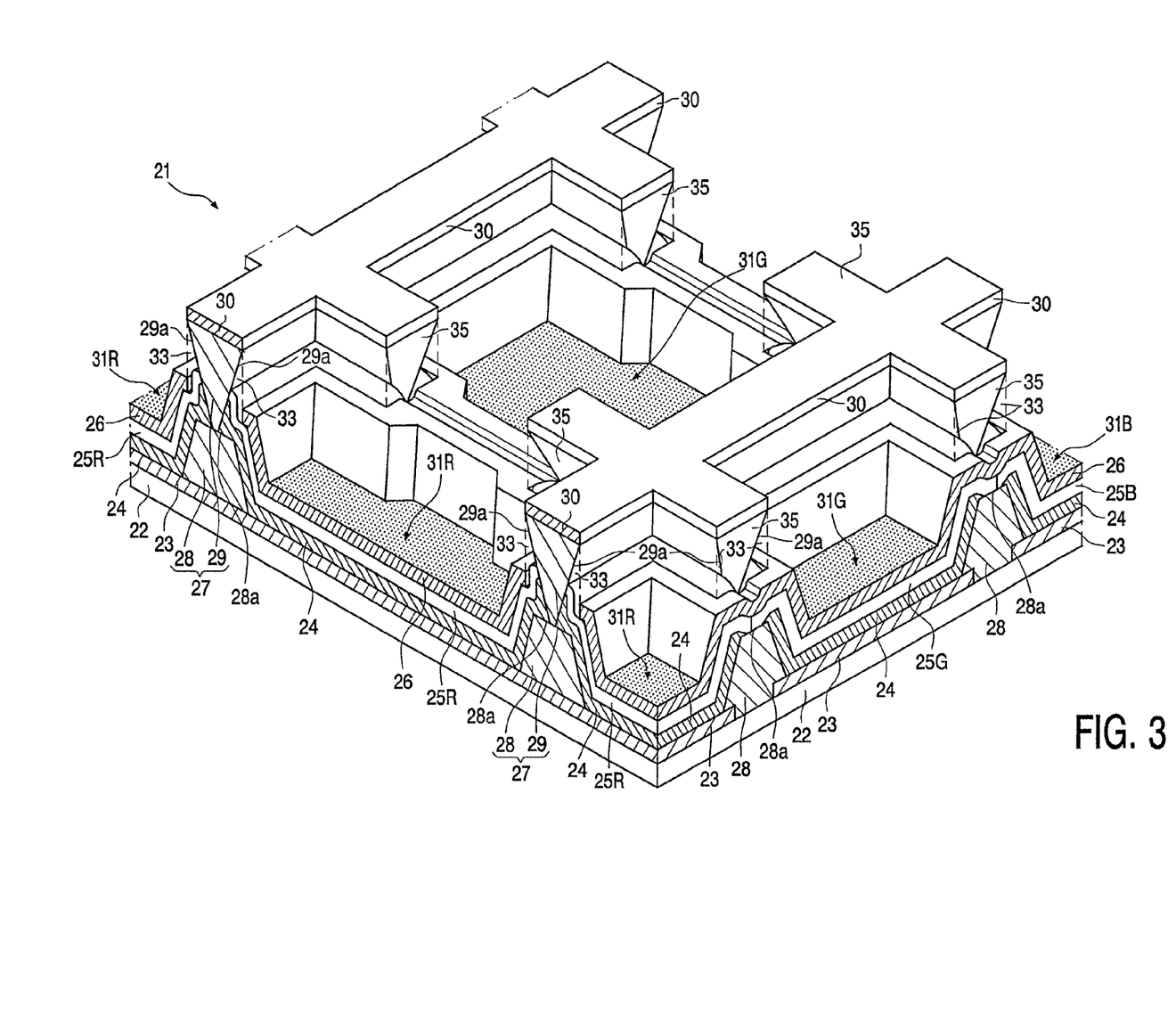

FIG. 3 schematically shows, in a perspective plan view, a part of an organic EL matrix display device 21 in accordance with the invention.

Figure 4:
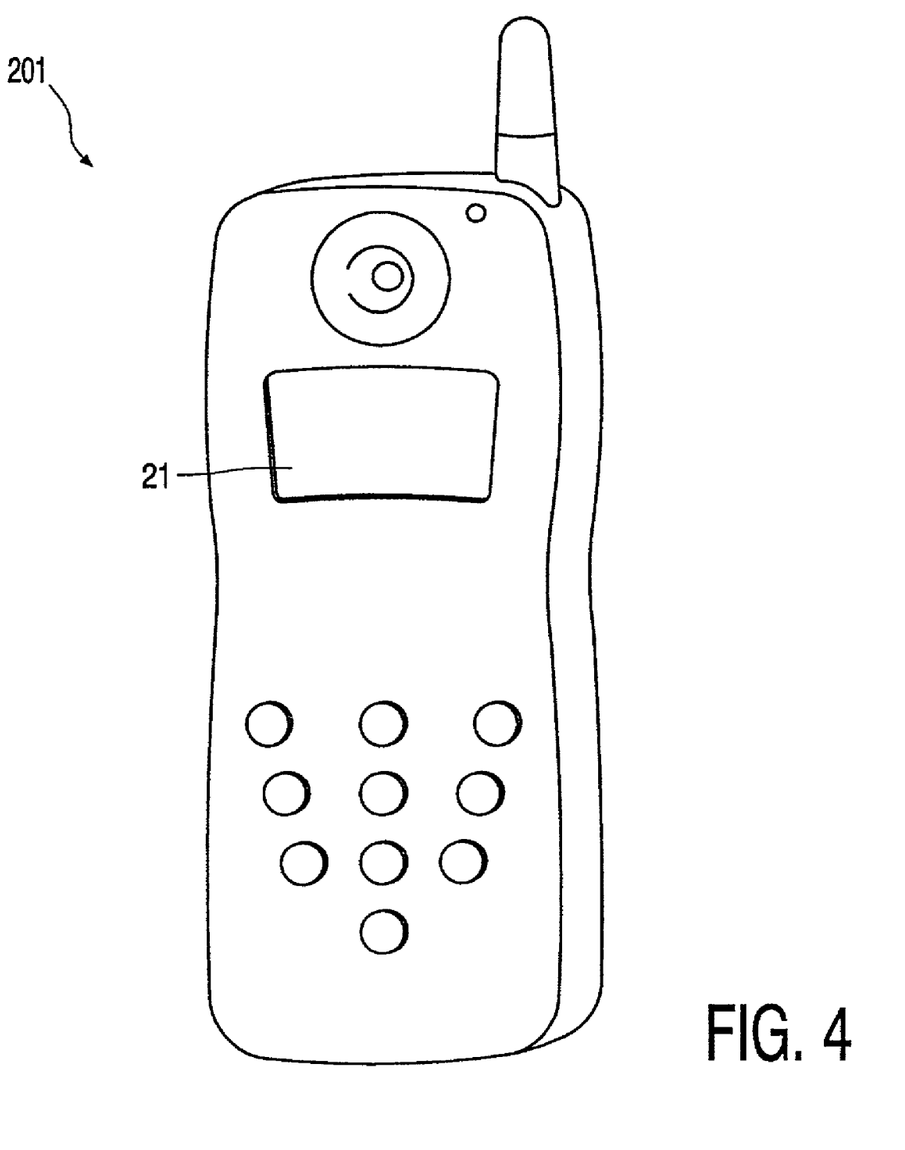

FIG. 4 schematically shows a mobile phone 101 provided with the EL device 21 in accordance with the invention.

The device 21 has EL multi-color pixels 31R, 31G and 31B and comprises a glass substrate 22 covered with a patterned first electrode layer in the form of hole-injecting row electrodes 23. A composite relief pattern 27 extending at least between and along the row electrodes 23 comprises a first relief pattern 29 having overhanging sections which is supported by a second relief pattern 28 having positively-sloped sections. The first relief pattern 29 is used to define the pattern of the second electrode layer 26. The purpose of the second relief pattern 28 is to define the outline of the pattern of the EL layers and of the pixels 31R, 31G, 31B of the EL device. The relief pattern has protrusions 35 which each extend, at the position of the protrusion, transversely to the boundary of the first relief pattern 29. The protrusions 35 block and/or reroute the channels 33 formed by the sidewalls 29a of the overhanging sections of the relief pattern 29 and the surface 28a supporting that relief pattern. The protrusions 35 are also overhanging sections which for the purpose of hindering the transport of fluid along the capillary channels 33 is by no means essential but is convenient for manufacturing purposes as they can be provided at the same time and using the same process as used for the first relief pattern 29.

Near the free ends of the protrusions 35 the strands of charge transport material present in the channels 33 are interrupted, thereby allowing a charge transport layer of mutually separate charge transport areas 24 to be provided using a wet deposition method such as spin-coating or ink-jet printing without the charge transport areas 24 being connected via charge transport material present in the channels. The protrusions 35 also prevent color bleeding in that, during for example ink-jet printing, the protrusions 35 block or least reroute the capillary channels 33 which without the protrusions 35 transport fluid containing electroluminescent layer material used for the EL layers 25R, 25G or 25B from one pixel to another. The exact boundary of the layers 25R, 25R, 25G and 25B near the free ends of the protrusions 35 is only indicated schematically, the exact outline of the boundary being dependent on many factors such as the rheological properties of the fluid from which the layers are obtained, the wetting characteristics of the substrate and the type of wet deposition method used. In the embodiment of FIG. 3, the layer 25G helps to hinder the transport of EL layer material for the layer 25R and 25B along the capillary channels 33 by providing the relief pattern 27 with, at least partially, a poorly wetting surface.

In any case, the protrusions 35 serve as means for hindering the transport of the fluid containing EL layer material for layers 25R, 25G or 25B to the extent that no EL layer material is drained from a pixel and subsequently redeposited in the light emitting area of a neighboring pixel arranged to emit a different color. The EL device 21 is completed by the second electrode layer 26 which is patterned in accordance with the pattern outlined by the overhanging sections of the first relief pattern 29. If second electrode layer material vapor is deposited in vacuo non-functional second electrode material 30 is present on top of the relief pattern 29.

By way of example, the EL device 21 can be manufactured as follows:

A substrate 22 of 1.1 mm thick soda-lime glass coated with a 15 Ω/square 150 nm thick ITO layer (Balzers) is provided and the ITO layer patterned in a 280 μm wide lines and 30 μm wide spaces pattern in a conventional manner to obtain the first electrode layer comprising first electrodes in the form of row electrodes 23 which serve as the anodes of the EL elements 31R, 31G and 31B.

In order to provide the second relief pattern 28 of the composite pattern 27, the substrate is spin-coated with conventional photoresist, the photoresist exposed using a mask and developed. The relief pattern 28 has a matrix pattern of positively-sloped sections defining about 270 by 270 μm pixels 31R, 31G and 31B. The narrow sections of the relief pattern 28 are 40 μm wide, whereas the broader sections supporting the protrusions 35 are 60 μm wide. The height of the relief pattern 28 is 4 μm. The relief pattern 28 is then hard-baked so as to render it resistant to the process of providing the relief pattern 29.

The substrate is then spin-coated (1000 rpm) with a layer of the image reversal photoresist AZ5218-e (AZ Hoechst). The photoresist is exposed pattern-wise using a mask in proximity (40 μm gap) with a dose of 32 mJ/cm$^2$, hard-baked at 110° C. for 10 min, flood exposed with a dose of 400 mJ/cm$^2$, developed using a 1:1 AZ-developer:deionized-water developer for a time sufficient to obtain a negative slope of 45°, and post-baked at 100° C. for 15 min. This results in a relief pattern 29 having protrusions 35 which extend transversely to the boundary 36 of the first relief pattern 29. Each of the overhanging sections has an inverted trapezoidal shape. The height of the relief pattern 29 is 2.0 μm. The total height of the relief pattern 27 is 6.0 μm.

The transverse profile of the second relief pattern 28 can be made more rounded by hard-baking the relief pattern 28, before applying the first relief pattern 29, at a temperature above its softening point for an extended period of time so that it is able flow somewhat.

A charge transport layer 24 of poly-3,4-ethylenedioxythiophene (PEDOT) is then ink-jetted according to the method described in embodiment 2 resulting in mutually separate areas each 250 nm thick and having a square resistance of 100 MΩ/square.

Subsequently, a green emitting electroluminescent layer 25G is ink-jetted in a manner similar to that described in embodiments 1 and 2. Then successively, a red and a blue light emitting electroluminescent layer of fluorene-based polymer supplied by Cambridge Display Technology Ltd, 25R and 25B respectively, are ink-jetted. Ink-jet solutions contain 1–1.5% by weight polymer in xylene and have a viscosity of about 5 mPa.

While using the first relief pattern 29 as a built-in shadow mask, 3 nm thick Ba and 200 nm thick Al layers are successively deposited on top of the EL layer. The patterned Ba/Al layers thus obtained constitute the second electrode layer comprising a plurality of column electrodes (cathodes) 26.

The embodiment of FIG. 3 shows ITO electrodes 23 to be separated along each pixel. Alternatively, it is sufficient to have a single common ITO track 23 for each aggregate RGB-pixel 25R, 25G and 25B in order to be able to address each pixel individually.

The invention claimed is:

1. An electroluminescent device comprising:
    a first and a second electrode layer, at least the second electrode layer being provided in accordance with a desired pattern,
    one or more functional layers, the one or at least one of said functional layers being an electroluminescent layer,
    a relief pattern having one or more overhanging sections for defining the desired pattern of the second electrode layer,
    wherein the device is a matrix display device of the passive type comprising row electrodes as the first electrode layer, column electrodes as the second electrode layer, independently addressable electroluminescent elements formed at crossings of row and column electrodes, and the relief pattern having overhanging sections in the form of strips extending along and between the column electrodes, and
    wherein each of the strips include at least one protrusion extending transversely to the boundary of each of the strips and having a free end, wherein the at least one protrusion hinders transport of a fluid along a capillary channel formed by an overhanging section and a surface supporting the overhanging section.

2. An electroluminescent device as claimed in claim 1 wherein the relief pattern has one or more positively-sloped sections.

3. An electroluminescent device as claimed in claim 2, wherein the relief pattern is a composite relief pattern comprising a first relief pattern having overhanging sections overlaying or underlying a second relief pattern having positively-sloped sections.

4. An electroluminescent device as claimed in claim 3, wherein the first and second relief pattern are directly supported by a same substrate surface, except where the first and the second relief pattern cross each other.

5. An electroluminescent device as claimed in claim 3, wherein the second relief pattern provides the supporting surface of the first relief pattern.

6. A battery-operated and/or hand-held electronic device such as a mobile phone, provided with an electroluminescent device as claimed in claim 1.

7. A battery-operated and/or hand-held electronic device, such as a mobile phone, provided with the electroluminescent device of claim 2.

8. A battery-operated and/or hand-held electronic device, such as a mobile phone, provided with the electroluminescent device of claim 3.

9. A battery-operated and/or hand-held electronic device, such as a mobile phone, provided with the electroluminescent device of claim 4.

* * * * *